United States Patent
Gonzalez et al.

[11] Patent Number: 5,897,363
[45] Date of Patent: Apr. 27, 1999

[54] SHALLOW JUNCTION FORMATION USING MULTIPLE IMPLANT SOURCES

[75] Inventors: Fernando Gonzalez; Randhir Thakur, both of Boise, Id.

[73] Assignee: Micron Technology, Inc., Boise, Id.

[21] Appl. No.: 08/982,809

[22] Filed: Dec. 2, 1997

Related U.S. Application Data

[62] Division of application No. 08/654,573, May 29, 1996.
[51] Int. Cl.$^6$ ................................................ H01L 29/06
[52] U.S. Cl. ............................................ 438/527; 257/344
[58] Field of Search .................................. 438/231, 346; 257/527, 344

[56] References Cited

U.S. PATENT DOCUMENTS

| | | | |
|---|---|---|---|
| 4,907,048 | 3/1990 | Huang | 257/346 |
| 5,006,477 | 4/1991 | Farb | 438/231 |
| 5,045,901 | 9/1991 | Komori et al. | 257/344 |
| 5,091,763 | 2/1992 | Sanchez | 257/344 |
| 5,352,914 | 10/1994 | Farb | 257/336 |
| 5,434,440 | 7/1995 | Yoshitomi et al. | 257/344 |

OTHER PUBLICATIONS

Shu Qin, Chung Chan, Plasma Immersion Ion Implantation doping experiments for microelectronics, J. Vac. Sci. Technol. B, pp. 962–968, Mar. 1994.

Primary Examiner—Donald L. Monin, Jr.
Assistant Examiner—William David Coleman
Attorney, Agent, or Firm—Workman, Nydegger & Seeley

[57] ABSTRACT

Disclosed is a process for forming a shallow junction with a variable concentration profile gradation of dopants. The process of the present invention comprises, first providing and masking a surface on an in-process integrated circuit wafer on which the shallow junction is to be formed. Next, a low ion velocity and low energy ion bombardment plasma doping or PLAD operation is conducted to provide a highly doped inner portion of a shallow junction. In a further step, a higher ion velocity and energy conventional ion bombardment implantation doping operation is conducted using a medium power implanter to extend the shallow junction boundaries with a lightly doped outer portion. An anneal step follows. The result is a shallow junction with a variable concentration profile gradation of dopant. The junction is suitable for forming source and drain regions in MOS transistors, especially where a contact or interconnect is intended to engage the source and drain regions. The variable concentration profile gradation of dopants helps to maintain proper threshold voltage levels and reduces reverse bias current leakage.

26 Claims, 2 Drawing Sheets ically, an improved method would be an aid in the continued formation of more highly miniaturized and densified integrated circuits.

SHALLOW JUNCTION FORMATION USING MULTIPLE IMPLANT SOURCES

This application is a divisional of U.S. patent application Ser. No. 08/654,573, filed May 29, 1996, which is hereby incorporated by reference.

BACKGROUND OF THE INVENTION

1. The Field of the Invention

The present invention is directed to the manufacture of integrated circuits. More particularly, the present invention is directed to shallow junctions formed on in-process integrated circuit wafers and to methods of forming the shallow junctions using plasma doping.

2. The Relevant Technology

The semiconductor industry is in the midst of a movement toward greater integrated circuit densification and miniaturization. Resulting from this movement is the development of highly compact and efficient semiconductor devices, attended by an increase in the complexity and number of such semiconductor devices that can now be successfully aggregated on a single integrated circuit wafer. These benefits have in turn resulted in the availability of more compact and efficient integrated circuits, and in the lower cost of these integrated circuits.

The greater miniaturization and densification of semiconductor devices, including resistors, capacitors, diodes, and transistors, has been achieved, in part, by a reduction in the scale of the various components of the semiconductor devices. Among the components which have been reduced in scale as part of the miniaturization and densification movement are junctions which are formed by doping silicon substrates located on integrated circuit wafers. These junctions are used to form source and drain regions of MOS transistors, among other things, and comprise regions of silicon which are doped with dopants such as boron and phosphorous. The dopants allow silicon, normally only a semiconducting material, to conduct current through the addition of either electrons or electron holes, depending on the dopant type.

Reducing the depth of a junction in the silicon substrate helps in producing an integrated circuit with a resultant high circuit density, high speed, and low power consumption, and thereby aids in the miniaturization and densification of integrated circuits.

One area of recent progress in the formation of junctions is the development of a doping process known as plasma doping, or "PLAD." PLAD is a process involving the use of a plasma to assist in doping at a lower ion bombardment velocity and energy than conventional ion bombardment implantation doping processes which do not operate in a plasma. The plasma in the PLAD operation is biased with an energy relative to the silicon substrate that drives the dopants into the silicon substrate. PLAD results in a shallow doped junction that has a higher concentration of dopants than can be provided by conventional ion bombardment implantation doping processes. With PLAD processing, the shallow and heavily doped junctions allow the contacts or interconnects to be made correspondingly small. The higher concentration of dopants at the surface of the junction has an advantageous resistivity where the junction is connected to other structures through a contact or interconnect. When so doing, the shallow junction with a high concentration of dopants forms an interface with the contact or interconnect that has a lower resistivity than would be otherwise formed.

The shallow junction with a high dopant concentration formed in the PLAD process allows greater miniaturization and densification of the integrated circuit being formed, due to the capability of forming a contact or interconnect to the junction with a high degree of miniaturization and yet a low resistance interface. Nevertheless, the PLAD processes used to produce shallow junctions still exhibit certain problems.

Several of the problems encountered with PLAD processes are illustrated by the MOS transistor structure under formation in FIG. 1. FIG. 1 shows a step in the process of forming a MOS transistor structure in which a gate region 14 has been formed on a semiconductor substrate 10. Portions of semiconductor substrate 10 at the sides of gate region 14 have been doped through a gate oxide layer 12 with a PLAD process. The PLAD process has formed junctions 16 which are to serve as source and drain regions on the completed MOS transistor. Junctions 16 exhibit a high doping concentration that is relatively consistent and terminates abruptly at a bottom component 16a of each junction 16.

As PLAD is not highly selective of the atoms being driven into silicon substrate 10, heavier atoms within a carrier gas are driven into silicon substrate 10 with a greater force than dopant atoms, and are consequently driven to a greater depth. This inconsistency in depth causes a jagged unevenness to bottom component 16a of junctions 16. Junctions 16 also have a dopant concentration gradient that terminates abruptly at edges 16a. The abrupt dopant concentration gradient termination, together with unevenness of bottom component 16a, cause an undesirable increase in reverse bias current leakage. Reverse bias current leakage causes a drain of power through the integrated circuit when finished, a problem which is at odds with the low power requirements of modern integrated circuit applications.

The abrupt dopant concentration gradient termination at bottom component 16a of junction 16 can affect yield when forming a MOS transistor, in that a high amount of dopants at a greater depth may cause bottom component 16a of junctions 16 to substantially underlap gate region 14. The underlap of junctions below the gate is caused by a process known as outdiffusion. When junction underlap occurs, there is a decrease in the distance between junctions 16. The result of junction underlap is a high threshold voltage, which is the voltage required to cause the MOS transistor to conduct current. A high threshold voltage is generally undesirable in MOS transistors.

One method used in the prior art for solving the problem of excessive junction underlap has been to form polysilicon spacers on the sides of the gate region at the periphery thereof, such as spacers 18 of FIG. 2. Spacers 18 are formed by conventional processes at the edge of gate region 14 prior to PLAD. Spacers 18 further the distance between junctions 16 and prevent junction underlap below gate region 14, thus maintaining a low threshold voltage. Nevertheless, the use of spacers 18 does not solve the problems of reverse bias current leakage. The formation of spacers also adds processing steps and thus throughput time to the integrated circuit formation process.

From the above discussion, it is seen that a need exists in the art for an improved method of forming shallow junctions on semiconductor substrates. Specifically, an improved method of forming shallow junctions is needed which has the PLAD benefits of shallower junctions with higher concentrations of dopants, without the PLAD constraints of junction underlap, jagged unevenness of the bottom component of the junctions, and abrupt dopant concentration gradient termination. Such an improved method would be an aid in the continued formation of more highly miniaturized and densified integrated circuits.

SUMMARY AND OBJECTS OF THE INVENTION

The present invention seeks to resolve the above and other problems which have been experienced in the art. More particularly, the present invention constitutes an advancement in the art by providing a method of forming shallow junctions on silicon substrates of integrated circuit wafers which achieves each of the objects listed below.

It is an object of the present invention to provide a method of forming shallow, heavily doped junctions on silicon substrates of integrated circuit wafers in order to provide smaller, more efficient transistors, diodes, resistors, and other semiconductor devices.

It is another object of the present invention to provide such a method of forming shallow junctions which utilizes PLAD.

It is further an object of the present invention to provide such a method which remedies rough and jagged unevenness of the bottom component of the junctions, abrupt dopant concentration gradient termination of the junctions, and high reverse bias current leakage which result from PLAD formation of junctions.

To achieve the foregoing objects, and in accordance with the invention as embodied and broadly described herein in the preferred embodiment, a method is provided for forming a shallow junction with a variable profile gradation of dopants.

The first step of the method of the present invention comprises providing a semiconductor wafer having a surface on which to form the shallow junction. In one embodiment, the surface comprises a silicon substrate of an in-process integrated circuit wafer and the junction being formed comprises one of a source or a drain of a MOS transistor.

A further step comprises conducting a PLAD operation to form a shallow, highly doped inner portion of the junction having a high concentration of dopants.

A further step comprises conducting a second doping operation to form a lightly doped outer portion of the junction. In one embodiment, this step comprises a conventional ion bombardment implantation doping operation with low power and low dopant dosage. The conventional ion bombardment implantation doping operation is typically conducted with a medium power implanter. The result of the conventional ion bombardment implantation doping operation is a lightly doped outer portion surrounding a heavily doped inner portion. The lightly doped outer portion has a bottom edge that is more even and straight than edges of junctions formed by PLAD. The lightly doped outer portion also has a lower concentration of dopants than the heavily doped inner portion.

Another step of the method of the present invention is to anneal the semiconductor wafer. The anneal causes a more even distribution of dopant concentration therein and helps to remove imperfections in the internal lattice structure. The anneal is an optional step that can be conducted after each doping operation, or after any of the doping operations.

The doping operation which forms a heavily doped inner portion and the doping operation which forms a lightly doped outer portion can be conducted in reverse order. This is useful in forming a thin oxide layer over the surface. One application for the thin oxide layer is as an implant barrier to the PLAD operation. When using an implant barrier, a conventional ion bombardment implantation doping operation is conducted first, and then the thin oxide layer is deposited using a process such as TEOS. The PLAD operation is then conducted through the thin oxide layer. Thus, the lightly doped outer portion is formed without the existence of the thin oxide layer, while the thin oxide layer is present to serve as an implant barrier to the PLAD operation. This use of a thin oxide layer as an implant barrier in this embodiment further reduces the depth of the dopants implanted in the PLAD operation, while maintaining the depth of the dopants implanted by the conventional ion bombardment implantation doping operation. The use of a thin oxide layer as an implant barrier also maintains the high concentration of dopants on the surface of the shallow junction in order to form a low resistance contact and interconnect interface.

The result of the method of the present invention is a shallow junction which is useful for forming diodes, resistors, and transistors. The junction has a variable profile gradation of dopants, with a first concentration of dopants in a heavily doped inner portion, and a second, lower concentration of dopants in the deeper lightly doped outer portion. The junction is also formed with an even bottom edge which, along with the variable profile gradation of dopants, helps to eliminate reverse bias current leakage. The variable profile gradation of dopants also helps to reduce underlap, and thereby helps to maintain a low threshold voltage without the need for forming spacers.

The method of the present invention has been found to be easily integrated into the manufacturing flow process and to be relatively inexpensive.

BRIEF DESCRIPTION OF THE DRAWINGS

In order that the manner in which the above-recited and other advantages and objects of the invention are obtained will be understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings, which will be briefly described below.

DETAILED DESCRIPTION OF THE PREFERRED EMBODIMENTS

The present invention involves the discovery by the inventors that by creating a shallow junction that has a variable concentration profile gradation of dopants with a PLAD operation, the prior art problems of conventional PLAD processes of jagged unevenness of the bottom component of the junction, excessive underlap of junctions below a MOS gate due to outdiffusion of dopants, and reverse bias current leakage can be remedied. Thus, the present invention comprises a method of forming a shallow junction on a silicon substrate using PLAD, which results in a junction with a variable concentration profile gradation of dopants for the formation of a less abrupt dopant concentration gradient termination at the bottom component of the junction. The term "variable concentration profile gradation of dopants," as used herein, refers to a junction in which different depths of the junction have different concentrations of dopants. Thus, the shallow junction has differing concentrations throughout. In one embodiment, the junction is formed with a heavily doped inner portion having a shallow depth and a high concentration of dopants, around which is formed a lightly doped outer portion having a greater depth and a lower concentration of dopants.

The method of the present invention is illustrated in FIGS. 3 through 6. The first step of the method of the present invention is the preparatory step of providing a semiconductor wafer having a surface on which to form the shallow junction. This is typically conducted at the junction doping stage of conventional integrated circuit manufacturing processes, typically after gate stacks are defined and before a passivation layer is formed over the defined gate stacks. Thus, in the embodiment seen in FIG. 3, a silicon substrate 20 is provided on an in-process integrated circuit wafer.

Figure 1:
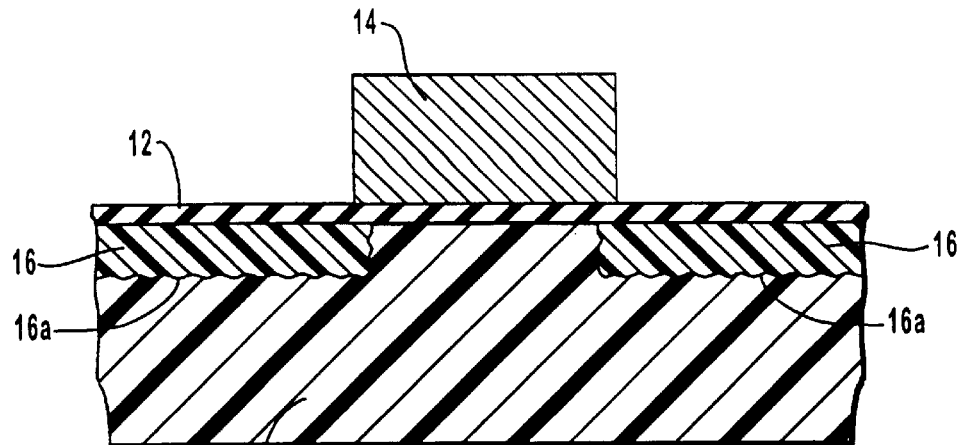
FIG. 1 is a cross-sectional depiction of a portion of an in-process integrated circuit wafer showing the results of a step of a conventional PLAD process of the prior art.
Figure 2:
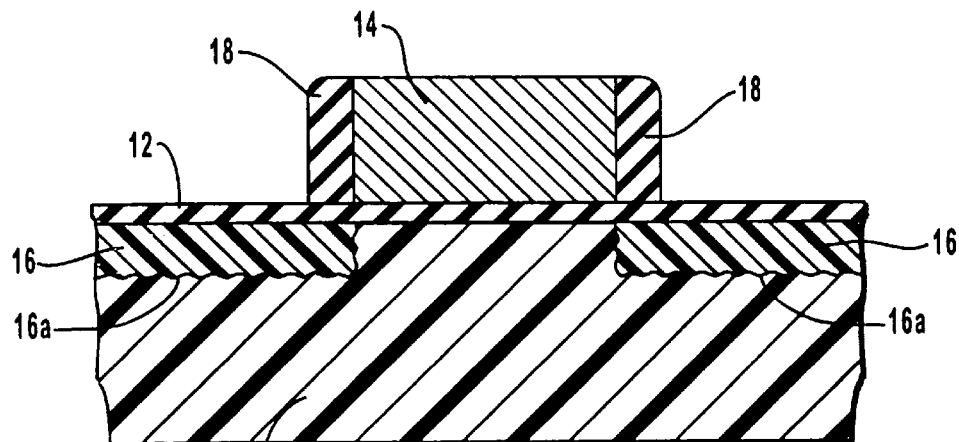
FIG. 2 is a cross-sectional depiction of a portion of an in-process integrated circuit wafer showing the results of a further step of the prior art PLAD process from that depicted in FIG. 1.
Figure 3:
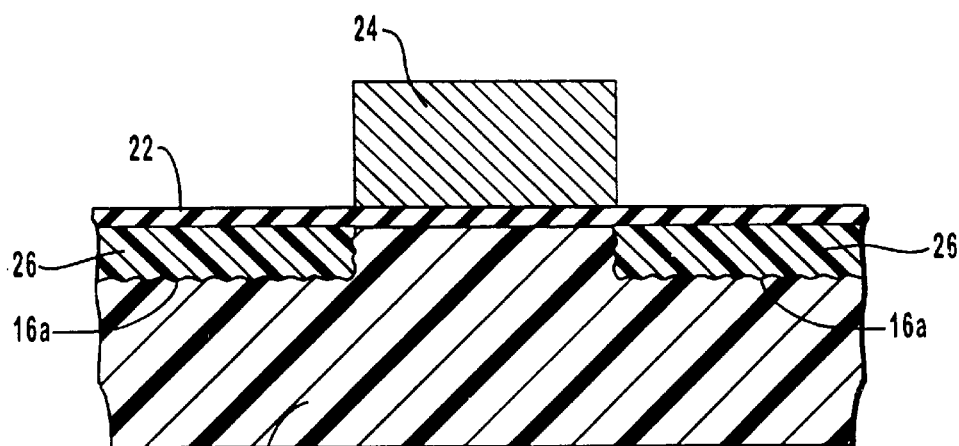
FIG. 3 is a cross-sectional depiction of a portion of an in-process integrated circuit wafer showing the results of a step of the method of the present invention.

In forming the partially completed gate structure of FIG. 3, gate oxide layer 22 is formed over silicon substrate 20. A gate region 24, which is formed over silicon substrate 10 and gate oxide layer 22, leaves exposed portions of silicon substrate 20 on which junctions will be formed.

The next step in the method of the present invention comprises conducting a PLAD operation to dope the exposed portion of silicon substrate 20, producing highly doped inner portions 26 having a depth of less than about 1000 angstroms. The PLAD operation is conducted in an energy range of about 5 KeV to about 15 KeV. Highly doped inner portions 26 will preferably be doped to a dopant concentration range of about $1 \times 10^{19}$ to about $1 \times 10^{21}$ atoms per cm$^3$. Any common dopant, such as boron or phosphorus, can be doped into silicon substrate 20. PLAD process machines are available from Varian Associates of Palo Alto Calif., USA.

The PLAD operation is followed with a conventional ion bombardment implantation doping operation using dopants of the same type as were used for the PLAD operation. The conventional ion bombardment implantation doping operation is conducted without a plasma. Preferably, the conventional ion bombardment implantation doping operation is conducted at the higher energy range of between about 10 KeV and about 25 KeV using a medium current implanter. A medium current implanter is an implanter which operates in an energy range of about 0 to about 200 KeV, such as the E500 manufactured by Varian Associates of Palo Alto Calif., USA.

The conventional ion bombardment implantation doping operation results in a set of junctions 30 with lightly doped outer portions 28 which extend to a greater depth than highly doped inner portions 26, and which have a lower concentration of dopants than highly doped inner portions 26. The concentration of dopants of lightly doped outer portions 28 is preferably in a range of about $1 \times 10^{16}$ to about $1 \times 10^{19}$ atoms per cm$^3$. Each of lightly doped outer portions 28 preferably will circumscribe and extend below and beyond a corresponding highly doped inner portions 26 by a depth in a range of about 250 angstroms to about 750 angstroms. The conventional ion bombardment implantation doping operation step will increase the dopant concentration in highly doped inner portions 26, and will also create lightly doped outer portions 28.

Due to the capability of conventional ion bombardment implantation doping operations of implanting with a more constant depth than PLAD processes, lightly doped outer portions 28 are formed with even an bottom component, rather than the jagged uneven bottom component formed by conventional PLAD processes. Thus, the lightly doped outer portion has an lower periphery 32, seen in FIG. 4, that is substantially planar and parallel to the silicon substrate.

An optional further step of the method of the present invention comprises annealing junctions 30. This anneal can be accomplished by conventional annealing processes, while conventional rapid thermal annealing (RTA) is preferred. Annealing achieves a normalizing of the doping gradient, helping to more evenly distribute dopants within highly doped inner portions 26 and lightly doped outer portions 28. Annealing can be conducted after one or more of the doping operations.

Figure 4:
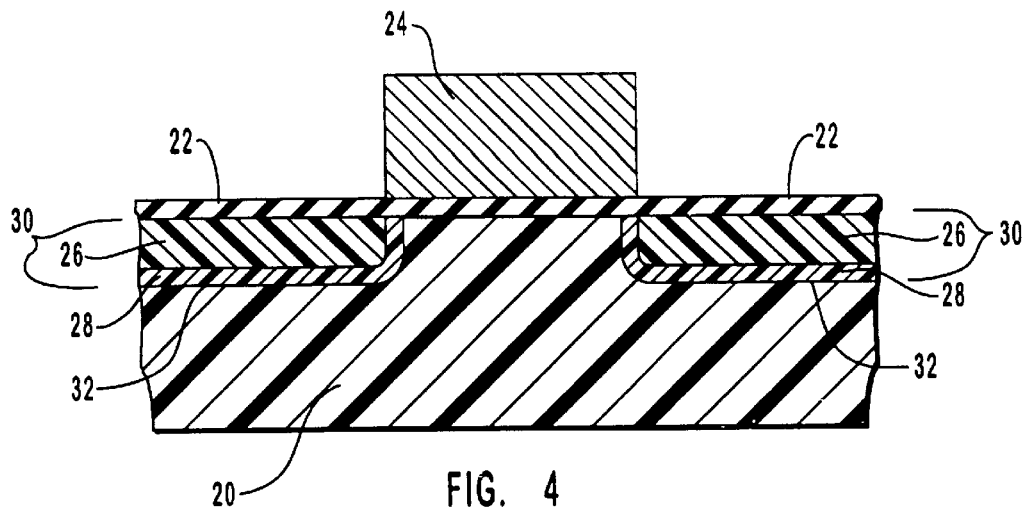
FIG. 4 is a cross-sectional depiction of a portion of an in-process integrated circuit wafer showing the results of a further step of the method of the present invention from that depicted in FIG. 3.

The foregoing steps result in the structure of FIG. 4, in which highly doped inner portions 26 and lightly doped outer portions 28 form junctions 30, each having a variable concentration profile gradation of dopants. As seen therein, lightly doped outer portions 28 slightly underlap gate region 24, but highly doped inner portions 26 do not substantially underlap gate region 24. This allows for a greater concentration of dopants in junction 30, while allowing only a minor portion of all dopants injunction 30 to underlap gate region 24. This helps to maintain a low threshold voltage without the need, as discussed in the Background Section above, for spacers on the side of the gate.

The structure of FIG. 4 also produces a less abrupt, more tailored doping concentration gradation with a variable dopant concentration profile which has been found to reduce reverse bias current leakage. Thus, the use of PLAD allows the formation of a shallow junction with a high dopant concentration close to the surface of silicon substrate 20, which helps to subsequently form lower resistance contacts and interconnects superadjacent thereto, while the method of the present invention eliminates the aforementioned problems with conventional PLAD processes.

Figure 5:
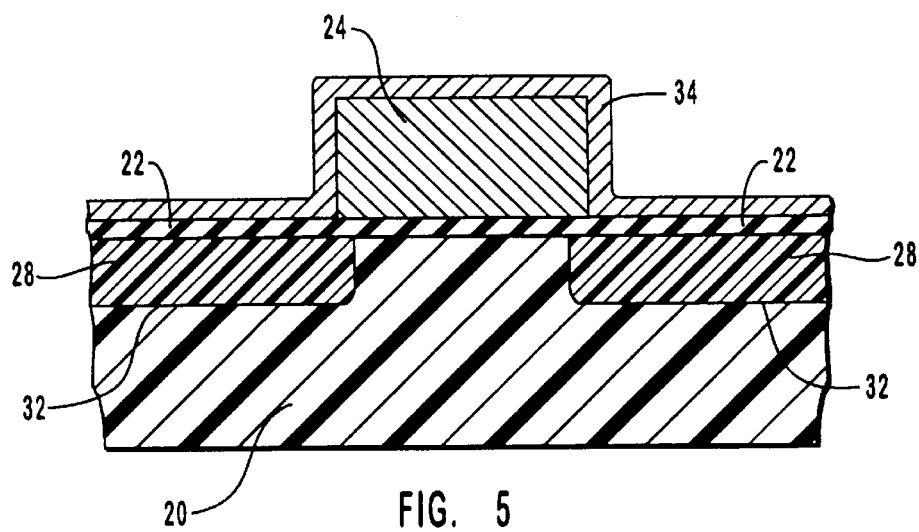
FIG. 5 is a cross-sectional depiction of a portion of an in-process integrated circuit wafer showing the results of a step of an alternate embodiment of the method of the present invention.
Figure 6:
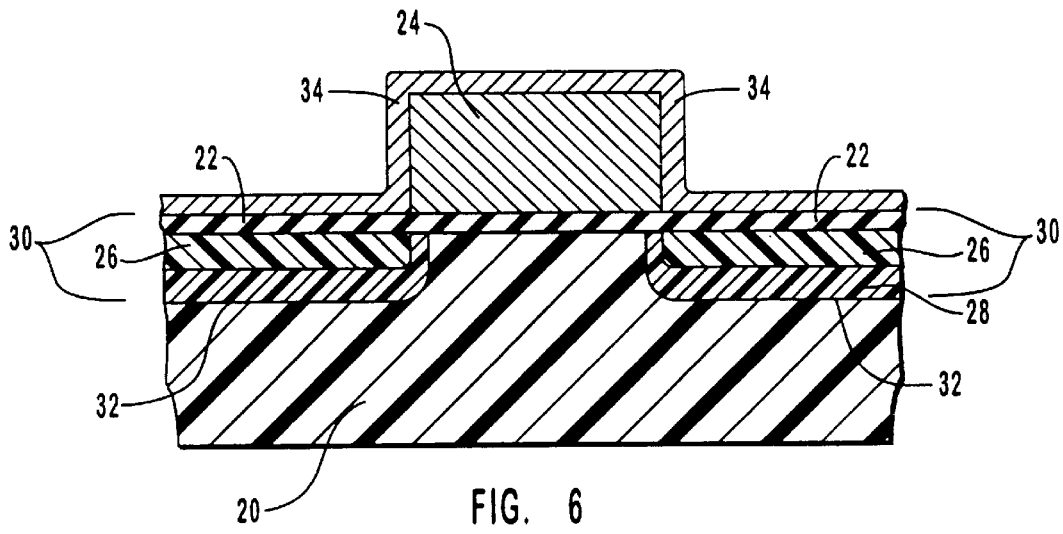
FIG. 6 is a cross-sectional depiction of a portion of an in-process integrated circuit wafer showing the results of a further step of the alternate embodiment of the method of the present invention from that depicted in FIG. 5.

In an alternative embodiment, the conventional ion bombardment implantation operation is conducted first to form lightly doped outer portions 28 as are seen in FIG. 5. Afterwards, a PLAD operation is conducted to form highly doped inner portions 26 as seen in FIG. 6. As with the embodiment described above, an anneal step can be performed after one or both of these two doping steps.

In the embodiment where the conventional ion bombardment implantation operation is conducted first, a thin oxide layer can be formed over gate region 24 and junction 30 prior to the PLAD operation and after the conventional ion bombardment implantation operation. By way of example, a TEOS layer 34 seen in FIG. 5 is formed, preferably having a thickness in a range of about 50 to about 100 angstroms. The PLAD operation is then conducted through TEOS layer 34, such that the structure of FIG. 6 results. When so doing, TEOS layer 34 serves as an implant barrier to the PLAD operation. The use of TEOS layer 34 as an implant barrier further reduces the depth of highly doped inner portions 26 while maintaining the depth of lightly doped outer portions 28. The use of thin oxide layer 22 as an implant barrier also maintains the high concentration of dopants on the surface of junctions 30, for subsequent formation of a low resistance contact and interconnect interface.

The process of the present invention is useful in forming structures other than the gate structure of FIG. 6. Thus, in an alternative embodiment, both the conventional ion bombardment implantation operation and the PLAD operation are conducted in either order, with a thin oxide layer such as gate oxide layer 22 present on a surface such as silicon substrate 20 of an in-process integrated circuit wafer, so as to produce a shallow junction with a variable concentration profile gradation of dopants in the surface under the thin oxide layer.

The present invention can be used to form semiconductor devices such as resistors, diodes, and transistors. It is especially useful for forming MOS transistors, and can be used in forming both p-channel and n-channel MOS transistors. The method of the present invention has been found to be easily integrated into the manufacturing flow process and to be relatively inexpensive.

The method of the present invention solves several of the problems existing in conventional PLAD process implementations, and can be used to form a shallow junction with low resistivity for a contact and interconnect interface, such that a more densified and miniaturized integrated circuit can be formed. The method of the present invention also forms a junction with a more desirable variable concentration profile gradation of dopants with a smooth dopant concentration transition throughout the junction, and without significant junction underlap below a gate due to outdiffusion, such that a low threshold voltage is maintained and reverse bias current leakage is substantially reduced.

The method of the present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming an electrical structure on a substrate, the method comprising:

forming a first doped region in a substrate with a PLAD operation, the first doped region having a first dopant concentration and extending from a surface of the substrate to a first depth of less then about 1000 Å, the first doped region being bounded within the substrate by a periphery, including a portion at the first depth; and forming a second doped region in the substrate, the second doped region having a second dopant concentration that is less than the first dopant concentration, a portion of the second doped region being bounded by the periphery of the first doped region, the second doped region extending to a second depth within the substrate that is greater than the first depth.

2. A method as recited in claim 1, further comprising annealing the substrate after forming the second doped region.

3. A method as recited in claim 2, wherein annealing the substrate is conducted for a predetermined period of time sufficient to cause a more uniform distribution of dopant across both the first doped region and the second doped region than prior to the annealing.

4. A method as recited in claim 1, wherein the second depth is less than about 1000 Å.

5. A method as recited in claim 1, wherein the substrate comprises a silicon-containing material and an oxide layer positioned on the silicon-containing material, the first doped region being formed by causing a substantial portion of a first dopant to pass through the oxide layer and into the silicon-containing material, the second doped region being formed by causing a substantial portion of a second dopant to pass through the oxide layer and into the silicon-containing material.

6. A method as recited in claim 1, wherein forming the first doped region is conducted prior to forming the second doped region.

7. A method as recited in claim 1, wherein forming the second doped region is conducted prior to forming the first doped region.

8. A method as recited in claim 1, wherein forming the first doped region comprises a PLAD operation.

9. A method as recited in claim 8, wherein the PLAD operation is conducted at an energy in a range from about 5 KeV to about 15 KeV such that the first dopant concentration is in a range from about $1 \times 10^{19}$ dopant atoms/cm$^3$ to about $5 \times 10^{21}$ dopant atoms/cm$^3$.

10. A method as recited in claim 9, wherein forming the second doped region comprises ion bombardment implantation operating without a plasma.

11. A method as recited in claim 10, wherein the ion bombardment implantation is conducted at an energy in a range from about 10 KeV to about 25 KeV such that the second dopant concentration is in a range from about $1 \times 10^{16}$ dopant atoms/cm$^3$ to about $1 \times 10^{19}$ dopant atoms/cm$^3$, the ion bombardment implantation being conducted in a medium power implanter operating in a range from about 0 KeV to about 200 KeV.

12. A method as recited in claim 1, wherein the first doped region and the second doped region together comprise a source/drain region of an MOS transistor, the method further comprising forming a gate region over the substrate, the gate region having sides that are free of spacers, the source/drain region being formed substantially without underlapping the gate region.

13. A method as recited in claim 7, further comprising forming an electrically insulating layer over the surface prior to forming the first doped region, such that the first doped region is formed through the electrically insulating layer.

14. A method as recited in claim 13, further comprising forming a gate region on the surface prior to forming the electrically insulating layer, the electrically insulating layer being formed over the surface and over the gate region.

15. A method as recited in claim 2, further comprising annealing the substrate after forming the first doped region in addition to annealing the substrate after forming the second doped region.

16. A method of forming an electrical structure on a substrate, the method comprising:

conducing a PLAD operation on a surface of a substrate at an energy in a range from about 5 KeV to about 15 KeV to form a first doped region in the substrate, the first doped region extending from the surface to a first depth of less than about 1000 Å and having a first dopant concentration in a range from about $1 \times 10^{19}$ dopant atoms/cm$^3$ to about $1 \times 10^{21}$ dopant atoms/cm$^3$;

conducting ion bombardment implantation without a plasma at an energy in a range form about 10 KeV to about 25 KeV, the ion bombardment implantation being conducted in a medium power implanter operating in a range from about 0 KeV to about 200 KeV, a second doped region being thereby formed in the substrate, the second doped region extending from to a second depth within the substrate that is greater than the first depth, the second doped region having a second dopant concentration that is less than the first dopant concentration; and annealing the substrate.

17. A method of forming an electrical structure on a substrate, the method comprising:

providing a gate region n a substrate, the gate region being free of sidewall spacers;

providing an electrically insulating layer formed over a surface of the substrate and over the gate region;

conducting a PLAD operation on the surface of the substrate at an energy in a range from about 5 KeV to about 15 KeV to form a first doped region in the substrate, the first doped region having a first dopant concentration in a range from about $1 \times 10^{19}$ dopant atoms/cm$^3$ to about $5 \times 10^{21}$ dopant atoms/cm$^3$, the first doped region extending from the surface to a first depth of less than about 1000 Å; and conducting ion bombardment implantation without a plasma at an energy i a range from about 10 KeV to about 25 KeV, the ion bombardment implantation being conducted in a medium power implanter, a second doped region being thereby formed in the substrate, the second doped region extending to a second depth within the substrate that is greater than the first depth, the second doped region further having a second dopant concentration in a range from about $1 \times 10^{16}$ dopant atoms/cm$^3$ to about $1 \times 10^{19}$ dopant atoms/cm$^3$, a source/drain region of an MOS transistor being formed in the substrate by both the first doped region and the second doped region, the source/drain region being formed substantially without underlapping the gate region.

18. A method for forming an electrical structure, the method comprising:

providing a semiconductor substrate; and forming a doped active region within the semiconductor substrate, the doped active region having a concentration of dopants that generally decreases with increasing depth into the semiconductor substrate, wherein forming the doped active region includes:

implanting into the semiconductor substrate first dopant ions having energies in a range from about 5 KeV with a PLAD operation to about 15 KeV, the first dopant ions being implanted into the semiconductor substrate at a first concentration and to a first maximum depth less than about 1,000 Å; and implanting into the semiconductor substrate second dopant ions having energies in a range from about 10 KeV to about 25 KeV, the second dopant ions being implanted into the semiconductor substrate at a second dopant concentration that is less than the first dopant concentration and to a second maximum depth that exceeds the first maximum depth by an amount in a range from about 250 Å to about 750 Å.

19. A method as defined in claim 18, wherein the second dopant ions are implanted such that the doped active region has a substantially planar periphery at the second maximum depth.

20. A method as defined in claim 18, wherein implanting the first dopant ions and implanting the second dopant ions are conducted such that the doped active region forms a portion of an electrical device that is selected from the group consisting of a diode, a resistor, and a transistor.

21. A method as defined in claim 18, wherein the doped active region is a source/drain region and wherein the method further comprises, prior to forming the doped active region, forming a transistor gate stack on the semiconductor substrate, the transistor gate stack including a volume of an electrically conductive material.

22. A method for forming an electrical structure, the method comprising:

providing a semiconductor substrate having a top surface; and providing a volume of an electrically conductive material on a portion of the top surface of the semiconductor substrate;

forming a first active region and a second active region within the semiconductor substrate and separated one from another, both the first active region and the second active region being positioned adjacent opposite sides of the volume of electrically conductive material, each of the first active region and the second active region being doped with a concentration of dopants that generally decreases with increasing depth into the semiconductor substrate, wherein forming each of the first active region and the second active region includes:

implanting into the semiconductor substrate first dopant ions having energies in a range from about 5 KeV to about 15 KeV with a PLAD operation, the first dopant ions being implanted into the semiconductor substrate at a first concentration and to a first maximum depth less than about 1,000 Å; and implanting into the semiconductor substrate second dopant ions a range having energies in a range from about 10 KeV to about 25 KeV, the second dopant ions being implanted into the semiconductor substrate at a second dopant concentration that is less than the first dopant concentration and to a second maximum depth that exceeds the first maximum depth by an amount in a range from about 250 Å to about 750 Å.

23. A method as defined in claim 22, wherein both the first doped active region and the second doped active region are formed simultaneously.

24. A method of forming an electrical structure on a substrate, the method comprising:

forming a first doped region in a substrate with a PLAD operation, the first doped region having a first dopant concentration and extending from a surface of the substrate to a first depth of less than about 1000 Å, the first doped region being bounded within the substrate by a periphery, including a portion at the first depth; and forming a second doped region in the substrate, the second doped region having a second dopant concentration that is less than the first dopant concentration, a portion of the second doped region being bounded by the periphery of the first doped region, the second doped region extending to a second depth within the substrate that is greater than the first depth, said second depth exceeding the first depth by an amount in a range from about 250 Å to about 750 Å.

25. A method of forming an electrical structure on a substrate, the method comprising:

conducting a PLAD operation on a surface of a substrate at an energy in a range from about 5 KeV to about 15

KeV to form a first doped region in the substrate, the first doped region extending from the surface to a first depth of less than about 1000 Å and having a first dopant concentration in a range from about $1\times10^{19}$ dopant atoms/cm$^3$ to about $1\times10^{21}$ dopant atom/cm$^3$;

conducting ion bombardment implantation without a plasma at an energy in a range from about 10 KeV to about 25 KeV, the ion bombardment implantation being conducted in a medium power implanter operating in a range from about 0KeV to about 200 KeV, a second doped a second depth within the substrate, the second doped region extending from to a second depth within the substrate that exceeds the first depth by an amount in a range from about 250 Å to about 750 Å, the second doped region having a second dopant concentration that is less than the first dopant concentration; and annealing the substrate.

26. A method of forming an electrical structure on a substrate, the method comprising:

providing a gate region on a substrate, the gate region being free of sidewall spacers;

providing an electrically insulating layer formed over a surface of the substrate and over the gate region;

conducting a PLAD operation on the surface of the substrate at an energy in a range from about 5 KeV to about 15 KeV to form a first doped region in the substrate, the first doped region having a first dopant concentration in a range from about $1\times10^{19}$ dopant atoms/cm$^3$ to about $5\times10^{21}$ dopant atoms/cm$^3$, the first doped region extending from the surface to a first depth of less than about 1000 Å; and conducting ion bombardment implantation without a plasma at an energy in a range form about 10 KeV to about 25 KeV, the ion bombardment implantation being conducted in a medium power implanter, a second doped region being thereby formed in the substrate, the second doped region extending to a second depth within the substrate that exceeds the first depth by an amount in a range from about 250 Å to about 750 Å, the second doped region further having a second dopant concentration in a range from about $1\times10^{16}$ dopant atoms/cm$^3$ to about $1\times10^{19}$ dopant atoms/cm$^3$, a source/drain region of an MOS transistor being formed in the substrate by both the first doped region and the second doped region, the source/drain region being formed substantially without underlapping the gate region.

* * * * *

UNITED STATES PATENT AND TRADEMARK OFFICE
CERTIFICATE OF CORRECTION

PATENT NO. : 5,897,363
DATED : Apr. 27, 1999
INVENTOR(S) : Fernando Gonzalez; Randhir Thakur It is certified that error appears in the above-identified patent and that said Letters Patent is hereby corrected as shown below:

Col. 6, line 35, after "dopants" change "injunction" to --in junction--

Col. 8, line 59, before "a PLAD" change "conducing" to --conducting--

Col. 8, line 67, after "range" change "form" to --from--

Col. 9, line 12, after "region" change "n" to --on--

Col. 9, line 26, after "energy" change "i" to --in--

Col. 11, line 10, after "about" change "0KeV" to --0 KeV--

Col. 11, line 11, after "doped" change "a second depth within the substrate" to --region being thereby formed in the substrate--

Col. 12, line 9, after "range" change "form" to --from--

Signed and Sealed this

Twenty-fifth Day of July, 2000

Q. TODD DICKINSON

Attest:

Attesting Officer

Director of Patents and Trademarks